United States Patent
Steinmill

(10) Patent No.: US 7,365,546 B2
(45) Date of Patent: Apr. 29, 2008

(54) APPARATUS AND METHOD FOR NON-DESTRUCTIVE TESTING OF PRIMERS, IN PARTICULAR FOR AIRBAGS IN MOTOR VEHICLES

(75) Inventor: Peter Steinmill, Schwarzenbruck (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/981,604

(22) Filed: Nov. 5, 2004

(65) Prior Publication Data

US 2005/0231218 A1 Oct. 20, 2005

(30) Foreign Application Priority Data

Nov. 5, 2003 (DE) .......................... 203 17 198 U
Sep. 1, 2004 (DE) ...................... 10 2004 042 364

(51) Int. Cl.
G01R 31/00 (2006.01)
G01R 31/08 (2006.01)
G01R 27/08 (2006.01)

(52) U.S. Cl. ..................... 324/502; 324/713; 324/525

(58) Field of Classification Search .............. 324/713, 324/502
See application file for complete search history.

(56) References Cited

U.S. PATENT DOCUMENTS

| | | | |
|---|---|---|---|
| 4,893,109 A | | 1/1990 | Vrabel et al. |
| 5,541,523 A | * | 7/1996 | Tourville et al. ............ 324/711 |
| 5,612,623 A | * | 3/1997 | Watanabe et al. ........... 324/549 |
| 5,621,326 A | | 4/1997 | Watanabe et al. |
| 5,850,085 A | * | 12/1998 | Rosenbluth ............. 250/559.21 |
| 6,288,551 B1 | * | 9/2001 | Zabler et al. ................. 324/502 |
| 6,300,764 B1 | * | 10/2001 | Kelley .......................... 324/502 |
| 6,943,555 B2 | * | 9/2005 | Dick et al. .................... 324/502 |
| 2003/0056677 A1 | * | 3/2003 | Griggs et al. ............. 102/202.1 |
| 2003/0218462 A1 | | 11/2003 | Dick et al. |

FOREIGN PATENT DOCUMENTS

| | | |
|---|---|---|
| DE | 39 20 693 A1 | 10/1991 |
| DE | 195 20 373 A1 | 7/1995 |
| DE | 195 30 238 A1 | 2/1997 |
| DE | 195 32 628 A1 | 6/1997 |
| DE | 198 37 167 A1 | 11/1999 |
| DE | 198 36 672 A1 | 2/2000 |
| DE | 199 00 978 C2 | 7/2000 |
| EP | 0 577 988 A1 | 1/1994 |

OTHER PUBLICATIONS

Derwent copy of DE 19530238, with an english abstract—Drobney et al. Published Feb. 20, 1997.*

* cited by examiner

Primary Examiner—Andrew H. Hirshfeld
Assistant Examiner—Jeff Natalini
(74) Attorney, Agent, or Firm—Sughrue Mion, PLLC

(57) ABSTRACT

A measuring device and a measuring method for non-destructive testing of an ignitor installed in a subassembly, particularly of a motor vehicle. The device and measuring method generate a measuring current with a predefined value, check-test the predefined value of the measuring current while bypassing the ignitor, apply the check-tested measuring current to the subassembly with the installed ignitor for a predefined time interval, determine the internal resistance of the subassembly with the installed ignitor, and derive a test signal indicating the installation condition based on a comparison with a setpoint value.

20 Claims, 1 Drawing Sheet

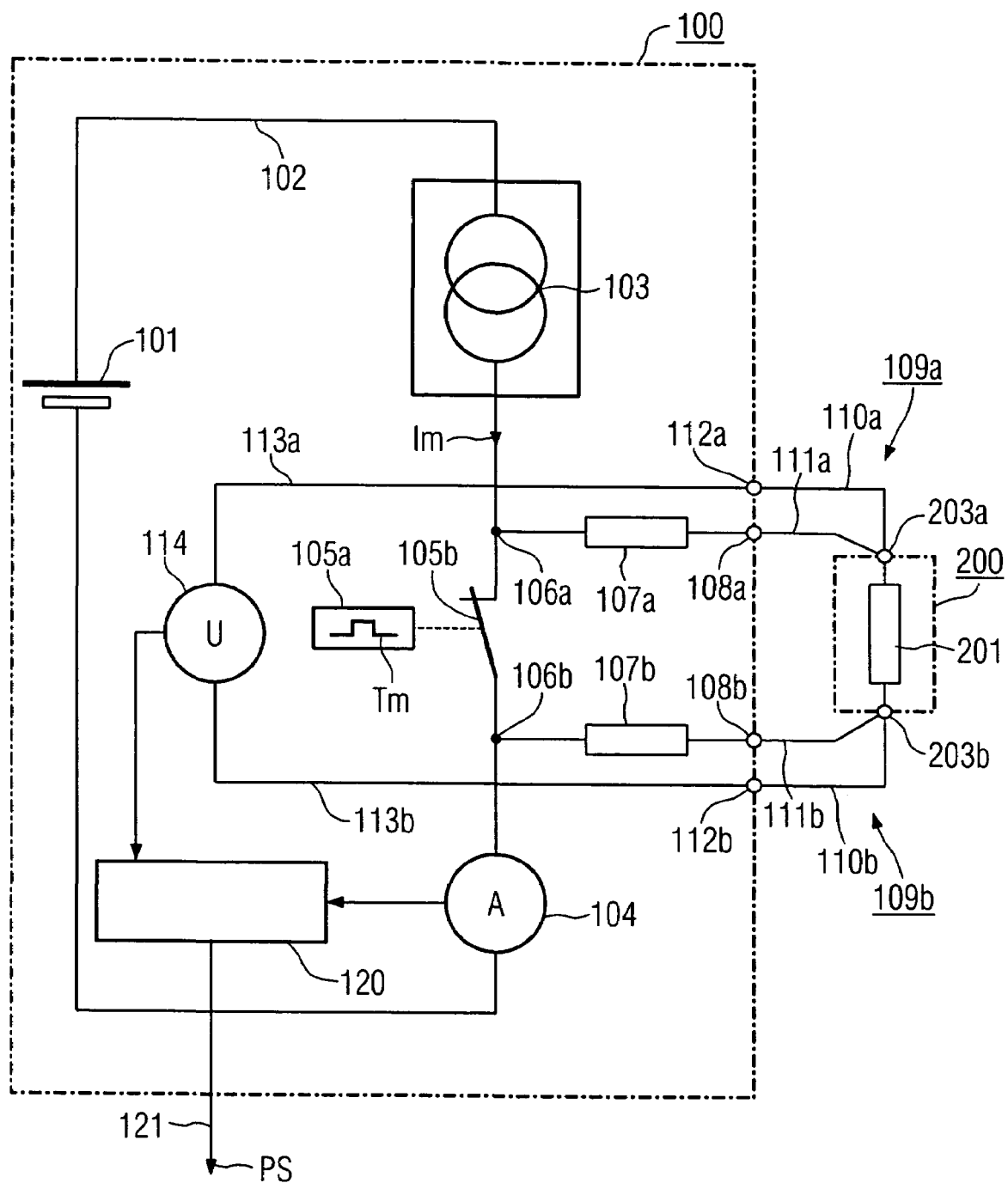

APPARATUS AND METHOD FOR NON-DESTRUCTIVE TESTING OF PRIMERS, IN PARTICULAR FOR AIRBAGS IN MOTOR VEHICLES

The following disclosure is based on German Patent Application Nos. 203 17 198.5, filed on Nov. 5, 2003 and 10 2004 042 364.4, filed on Sep. 1, 2004 which are incorporated into this application by reference.

BACKGROUND OF THE INVENTION

1. Field of the Invention

The present invention relates to an apparatus and method for non-destructive testing of primers. More particularly, the present invention relates to an apparatus and method for non-destructive testing of a subassembly of a vehicle that includes an ignitor for activating an airbag or a belt tightener.

2. Description of the Related Art

An ignitor is an ignition element in the form of a resistance heating element or a resistance wire used to activate an airbag or a belt tightener, for example. To activate the ignitor, an electrical current is applied to the ignitor. The electrical energy supplied is converted by the ignitor into thermal energy, which in turn is supplied to a gas generator coupled to the ignitor. The gas generator then releases the gas bound in tablet form to inflate, for example, an airbag.

The service readiness of a safety-related subassembly, or the ignitor integrated therein can be tested by measuring the ohmic resistance of the ignitor. If, for example, the measured electrical resistance is too high, this may indicates an interruption in the triggering circuit or an incorrectly installed part and thus, a non-functioning airbag or belt tightener. If, on the other hand, the resistance measured is too low, this may indicate a short circuit in the ignitor/cabling. In this case, the control circuit cannot generate enough power to activate the ignitor. A service-ready ignition element is determined when the measured resistance of the ignitor falls within a range specified by the manufacturer.

German Publication DE 199 00 978 C2 discloses a circuit arrangement in which a test current is fed into the ignitor to determine the resistance of the ignitor. Using a current mirror circuit, the test current flowing through the ignitor is applied to a measuring resistance. Finally, the voltage drop at the measuring resistance can be used to infer the magnitude of the ohmic resistance of the ignitor.

SUMMARY OF THE INVENTION

An aspect of the invention is to enable simple and non-destructive testing of the correct installation of a subassembly having an integrated ignitor.

In an exemplary embodiment, this aspect may be attained by a measuring device for non-destructive testing of an ignitor installed in a subassembly, particularly of a motor vehicle, comprising:

a) means for generating a measuring current having a predefined value, b) means for check testing the predefined value of the measuring current while bypassing the ignitor, c) means for applying the check tested measuring current to the subassembly with the installed ignitor for a predefined time interval, and d) means for determining the internal resistance of the subassembly with the installed ignitor and for deriving a test signal indicating the installation condition based on a comparison with a setpoint value.

Another aspect of the invention is attained by a measuring method for non-destructive testing of an ignitor installed in a subassembly, particularly of a motor vehicle, comprising:

a) a measuring current having a predefined value is generated, b) the predefined value of the measuring current is check tested while bypassing the ignitor, c) the check tested measuring current is applied to the subassembly with the installed ignitor for a predefined time interval, and d) the internal resistance of the subassembly with the installed ignitor is determined and a test signal indicating the installation condition is derived based on a comparison with a setpoint value.

The measuring device according to the invention and the measuring method according to the invention are used to determine the ohmic resistance of the subassembly in order to make a statement regarding the installation condition of the ignitor. To determine the internal resistance, a constant current is applied to the subassembly and thereby to the ignitor. The internal resistance of the ignitor can be determined by measuring the resulting voltage drop over the subassembly or the ignitor.

Before the measuring current is applied to the ignitor, the measuring current is fed into a branch parallel to the subassembly, such that the subassembly is initially at zero current. The magnitude of the measuring current is measured, and a check test is conducted to determine whether the measuring current corresponds to a predefined value. Only if this is the case, the measuring current is switched to the ignitor. This has the decisive advantage of largely excluding the risk of accidentally activating the ignitor during the test operation. Accidental activation of the ignitor is hazardous to persons and may cause significant material damage.

The method according to the invention makes it possible to detect whether the magnitude of the measuring current would cause the ignitor to be activated while the measuring current is passed through a branch parallel to the subassembly. In this case, the measuring current would not be switched to the subassembly.

If, on the other hand, the measuring current corresponds to the predefined value, the measuring current is applied to the subassembly and thus to the ignitor integrated in the subassembly for a predefined time interval. The predefined time interval is selected to be short enough to ensure that the ignitor is not activated by the energy supplied by the measuring current.

In one exemplary embodiment of the measuring device according to the invention, means are provided to test the predefined value of the measuring current, such that an error signal is generated as soon as the measuring current reaches an upper limit value, which is smaller than the minimum value of the current required to activate the ignitor. The error signal indicates the fault condition to a higher-level control and blocks the application of the measuring current to the subassembly, since the ignitor could otherwise be activated accidentally.

A highly reliable test operation can be realized using an embodiment of the measuring device according to the invention in which the means for generating the measuring current are configured such that the measuring current is upwardly limited by the limit value, which is smaller than the minimum current required to activate the ignitor. In this case the means for generating the measuring current has, for example, a current limiter, which prevents the generating of a measuring current that could supply sufficient energy to activate the ignitor. Thus, an accidental activation of the ignitor is prevented, for example, through hardware alone.

To ensure that the measuring current flows through the subassembly and the ignitor integrated in the subassembly for the duration of the predefined time interval, the means for applying the check tested measuring current to the subassembly with the installed ignitor advantageously has a time-controlled contact element for setting the predefined time interval.

The internal resistance of the subassembly can be determined quite easily by simultaneously measuring the current and the voltage on the subassembly. In one exemplary embodiment of the invention, the means for determining the internal resistance of the subassembly has a current measuring device and a voltage measuring device. The current measuring device and the voltage measuring device are interconnected with the subassembly such that a four-wire measurement can be realized to determine the internal resistance.

To control the test sequence to be performed by the measuring device, the measuring device may be provided with an interface to couple the measuring device to a computer. The computer is provided to control a test sequence to be performed by the measuring device. Until now, an installation test of an ignitor for an airbag or a belt tightener was conducted only after the ignitor was installed in the motor vehicle and connected to the control device assigned to the ignitor. For reasons of efficiency, however, it is better to conduct this test before installation in the vehicle and to control the test sequence using an external computer.

To detect defects in the measuring device, the measuring device preferably has means to conduct a self-test. The goal, among others, is to prevent a defect in the measuring device from accidentally activating the ignitor.

Heretofore, an installation test of an ignitor for an airbag or a belt tightener was conducted only after the ignitor was installed in the motor vehicle and connected to the control device assigned to the ignitor. For reasons of efficiency it is advantageous, however, if the measuring device is designed to test the subassembly before the subassembly is installed in the motor vehicle. This makes it possible to test the subassembly even before it reaches the actual end-of-line test.

One advantageous application of the measuring test is given, for example, if the measuring device is provided to test the installation of ignitors for airbags and/or belt tighteners. Alternatively, the measuring device or the measuring method can also be configured so that the measuring device can be used to test a deactivation switch of an airbag. A deactivation switch is used, for example, in passenger airbags, which can be deactivated when small children occupy the passenger seat. The deactivation resistance is connected in parallel to the ignitor via a switch. The measuring device is used to test whether the deactivation resistance falls within the allowable range.

BRIEF DESCRIPTION OF THE DRAWING

The above and other aspects of the present invention will become more apparent by describing in detail exemplary embodiments thereof with reference to the attached drawing in which:

FIG. 1 shows a circuit diagram for a measuring device for non-destructive testing of an ignitor installed in a subassembly of a motor vehicle according to an exemplary embodiment of the invention.

DETAILED DESCRIPTION OF EXEMPLARY EMBODIMENTS OF THE PRESENT INVENTION

Hereinafter, exemplary embodiments of the present invention will be described in detail with reference to the accompanying drawing.

Aspects of the present invention, and methods for achieving them will be apparent to those skilled in the art from the detailed description of the exemplary embodiments together with the accompanying drawings. However, the scope of the present invention is not limited to the exemplary embodiments disclosed in the specification, and the present invention can be realized in various types. The described exemplary embodiments are presented only for completely disclosing the present invention and helping those skilled in the art to completely understand the scope of the present invention, and the present invention is defined only by the scope of the claims.

As shown in FIG. 1, the measuring device 100, hereinafter also referred to as the measuring circuit 100, is coupled to the subassembly 200 to be tested. The subassembly can be, for example, a dashboard or a steering wheel of a motor vehicle. An ignitor 201 for deploying an airbag, for example, is integrated in the subassembly.

The measuring circuit 100 and the subassembly 200 are connected by an upper and a lower adapter cable 109a, 109b consisting of an upper and a lower adapter conductor 110a, 110b for a voltage measuring circuit 113a, 113b and an upper and a lower adapter conductor 111a, 111b for an instrument circuit. The separation between instrument circuit and voltage measuring circuit 113a, 113b makes it possible to determine the internal resistance of the subassembly using a four-wire measurement.

The adapter cables 109a, 109b connect plug-in contacts 108a, 108b of the measuring circuit 100 with an upper and a lower plug-in contact 203a, 203b of a cable harness, to which the ignitor 201 is electrically connected, and which are brought out of the subassembly 200 of the vehicle in which the ignitor 201 is installed. The upper and lower adapter conductors of the instrument circuit 111a, 111b further have a first series resistor 107a and a second series resistor 107b.

Parallel to the instrument circuit there is a time-controlled circuit element consisting of a switch 105b and a signal transmitter 105a, which determines the state of the switch 105b. When the switch 105b is closed the instrument circuit is shorted.

At the beginning of a test operation the switch 105b is closed. A power source 103 supplied by a supply voltage 101 generates a measuring current Im, such that the subassembly 200 is bypassed due to the shorting of the instrument circuit caused by the closed switch 105b. As a result, the ignitor 201 cannot be activated accidentally at this stage of the test sequence, irrespective of the magnitude of the measuring current Im.

A current measuring device 104 is used to first check the magnitude of the measuring current Im while the switch 105b is closed. If the measuring current corresponds to a predefined value, which is selected such that the ignitor cannot be activated by this current, an evaluation unit 120 sends a test signal PS to a higher-level control via a test signal line 121 to indicate to the control that the measuring current Im can be applied to the subassembly 200 without risk. If the measuring current Im is too large, an ERROR signal is transmitted via the signal line 121 and the switch 105b is prevented from opening.

If the measuring current corresponds to the predetermined value, the switch 105b is opened for a predefined time interval Tm. This time interval Tm is selected to be long enough to guarantee a reliable measurement. It may not be selected to be so long that there is a risk that the energy supplied via the current Im, which is applied to the ignitor 201, is sufficient to activate the ignitor 201.

While the switch 105b is open, the current flowing through the subassembly is measured using the current measuring device 104, and the voltage over the subassembly is measured using a voltage measuring device 114, which is connected to the subassembly 200 via the voltage measuring circuit 113a, 113b. The measured current and the measured voltage are evaluated by the evaluation unit 120 to determine the internal resistance of the subassembly 200. The internal resistance can be used to conduct an installation test of the ignitor 201.

The described measuring device 100 makes it possible to test the subassembly 200 before it is installed in a motor vehicle. Furthermore, the subassembly 200 does not need to be connected to the control unit that is provided for it within the motor vehicle. The test sequence is controlled, for example, by a computer, which is coupled to the measuring device 100 via an interface.

By testing the measuring current Im before applying the measuring current Im to the subassembly 200, an accidental activation of the ignitor 201 in connection with the test operation is reliably avoided.

Although exemplary embodiments of the present invention have been described for illustrative purposes, those skilled in the art will appreciate that various modifications, additions and substitutions are possible, without departing from the scope and spirit of the invention as disclosed in the accompanying claims, including the full scope of equivalents thereof.

The invention claimed is:

1. A measuring device for non-destructive testing of an ignitor installed in a subassembly comprising:
    means for generating a measuring current with a predefined value;
    means for check-testing the predefined value of the measuring current while bypassing the igniter;
    means for applying the check-tested measuring current to the subassembly with the installed ignitor for an adjustable time interval, the adjustable time interval to be at least one of a plurality of values, wherein the means for applying the check-tested measuring current to the subassembly includes a time-controlled circuit element for setting the adjustable time interval;
    means for determining an internal resistance of the subassembly with the installed ignitor and for deriving a test signal indicating an installation condition based on a comparison of the internal resistance of the subassembly with a setpoint value; and
    an interface for coupling the measuring device to a computer, wherein the computer controls a test sequence executed by the measuring device.

2. The measuring device as claimed in claim 1, wherein the means for check-testing the predefined value of the measuring current generates an error signal as soon as the measuring current reaches an upper limit value, which is smaller than a minimum value of current required to activate the ignitor.

3. The measuring device as claimed in claim 2, wherein the means for generating the measuring current are configured such that the measuring current is upwardly limited by the limit value, which is smaller than the minimum value of the current required for activating the ignitor.

4. The measuring device as claimed in claim 1, wherein the means for determining the internal resistance of the subassembly comprises a current measuring device and a voltage measuring device, wherein the current measuring device and the voltage measuring device are interconnected with the subassembly such that a four-wire measurement is implemented to determine internal resistance.

5. The measuring device as claimed in claim 1, further comprising means for conducting a self-test of the measuring device.

6. The measuring device as claimed in claim 1, wherein the measuring device is operable to test the subassembly before the subassembly is installed into a respective assembly.

7. The measuring device as claimed in claim 1, wherein the ignitor is installed in at least one of an airbag and a belt tightner, and the measuring device is operable to conduct an installation test of the ignitor.

8. The measuring device as claimed in claim 1, wherein the measuring device is operable to test a deactivation switch of an airbag.

9. A measuring method for non-destructive testing of an ignitor installed in a subassembly, comprising:
    generating a measuring current with a predefined value;
    check-testing the predefined value of the measuring current while bypassing the igniter;
    applying the check-tested measuring current to the subassembly with the installed ignitor for an adjustable time interval, the adjustable time interval to be at least one of a plurality of values, wherein the adjustable time interval is set using a time-controlled circuit;
    determining the internal resistance of the subassembly with the installed ignitor;
    deriving a test signal indicating the installation condition based on a comparison of the internal resistance of the subassembly with a setpoint value; and
    controlling a test sequence for testing the subassembly using a computer.

10. The measuring method as claimed in claim 9, further comprising generating an error signal as soon as the measuring current reaches an upper limit value, which is smaller than a minimum value of a current required to activate the ignitor.

11. The measuring method as claimed in claim 10, wherein the measuring current is upwardly limited by the limit value, which is smaller than the minimum value of the current required to activate the ignitor.

12. The measuring method as claimed claim 9, further comprising implementing a four-wire measurement to determine an internal resistance of the subassembly.

13. The measuring method as claimed in claim 9, further comprising conducting a self-test of components required for determining internal resistance of the subassembly prior to determining the internal resistance of the subassembly.

14. The measuring method as claimed in claim 9, further comprising testing the subassembly before the subassembly is installed in a respective assembly.

15. The measuring method as claimed in claim 9, wherein the measuring method is operable to test installation of at the ignitors of at least one of airbags and belt tighteners.

16. A measuring device for non-destructive testing of an ignitor installed in a subassembly comprising:
    a power source for generating a measuring current with a predefined value;

a current measuring device for check-testing the predefined value of the measuring current, and for measuring current flowing through the subassembly, the check-testing performed with the measuring current bypassing the igniter;

a time-controlled circuit for applying the check-tested measuring current to the subassembly with the installed ignitor for an adjustable time interval, the adjustable time interval to be at least one of a plurality of values;

a voltage measuring device that measures a voltage over the subassembly; and an evaluation unit that evaluates the current flowing through the subassembly and the voltage over the subassembly, determines a resistance of the subassembly with the installed ignitor, and derives a test signal indicating an installation condition of the ignitor based on a comparison of the resistance of the subassembly with a setpoint value.

17. The measuring device as claimed in claim 16, wherein the current measuring device generates an error signal as soon as the measuring current reaches an upper limit value, which is smaller than a minimum value of current required to activate the ignitor.

18. The measuring device as claimed in claim 17, wherein the power source is configured such that the measuring current is upwardly limited by the limit value, which is smaller than the minimum value of the current required for activating the ignitor.

19. The measuring device as claimed in claim 16, wherein the current measuring device and the voltage measuring device are interconnected with the subassembly such that a four-wire measurement is implemented to determine internal resistance.

20. The measuring device as claimed in claim 16, further comprising an interface for coupling the measuring device to a computer, wherein the computer is provided to control a test sequence executed by the measuring device.

* * * * *